(12) United States Patent
Liu

(10) Patent No.: US 7,732,991 B2
(45) Date of Patent: Jun. 8, 2010

(54) SELF-POLING PIEZOELECTRIC MEMS DEVICE

(75) Inventor: Lianjun Liu, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 425 days.

(21) Appl. No.: 11/864,266

(22) Filed: Sep. 28, 2007

(65) Prior Publication Data
US 2009/0085432 A1    Apr. 2, 2009

(51) Int. Cl.
*H01L 41/08*    (2006.01)
(52) U.S. Cl. .................. 310/331; 310/328; 310/330; 310/332
(58) Field of Classification Search .................. 310/328, 310/330–332
See application file for complete search history.

(56) References Cited

U.S. PATENT DOCUMENTS

| | | | | |
|---|---|---|---|---|
| 5,116,643 | A * | 5/1992 | Miller et al. | 427/126.3 |
| 5,719,607 | A * | 2/1998 | Hasegawa et al. | 347/70 |
| 5,920,422 | A * | 7/1999 | Kim | 359/295 |
| 5,966,787 | A * | 10/1999 | Nakayama et al. | 29/25.35 |
| 6,440,210 | B1 * | 8/2002 | Bruchhaus et al. | 117/4 |
| 6,507,475 | B1 | 1/2003 | Sun | |
| 7,151,425 | B2 | 12/2006 | Park et al. | |
| 2002/0077551 | A1 * | 6/2002 | Fleischman et al. | 600/459 |
| 2005/0127792 | A1 | 6/2005 | Mehta | |
| 2005/0156694 | A1 | 7/2005 | Park et al. | |
| 2005/0236935 | A1 * | 10/2005 | Ohmori et al. | 310/328 |
| 2007/0019081 | A1 | 1/2007 | Nakashima | |
| 2007/0094864 | A1 | 5/2007 | Park et al. | |
| 2008/0253714 | A1 * | 10/2008 | Poovey | 385/16 |

FOREIGN PATENT DOCUMENTS

WO    2005022575 A1    3/2005

OTHER PUBLICATIONS

Yamashita, K. et al.; "Characterization of Piezoelectric Property of Sol-Gel PZT Thin Films and Its Improvement by Poling", IEEJ Transactions on Sensors and Micromachines; 2004; pp. 124-128 (Abstract and 1st page of Article only included in transmission); vol. 124, No. 4; Japan.
Lee, Hee-Chiu; "Design, fabrication and RF performances of two different types of piezoelectrically actuated Ohmic MEMS switches", Journal of Micromechanics and Microengineering; 2005; pp. 2098-2104; vol. 15; UK.

* cited by examiner

*Primary Examiner*—Thomas M Dougherty

(57) ABSTRACT

A self-poling piezoelectric based MEMS device is configured for piezoelectric actuation in response to application of a device operating voltage. The MEMS device comprises a beam, a first electrode disposed on the beam, a layer of piezoelectric material having a self-poling thickness disposed overlying a portion of the first electrode, and a second electrode overlying the layer of piezoelectric material. The layer of piezoelectric material is self-poled in response to application of the device operating voltage across the first and second electrodes. In addition, the self-poled piezoelectric material has a poling direction established according to a polarity orientation of the device operating voltage as applied across the first and second electrodes.

20 Claims, 2 Drawing Sheets

SELF-POLING PIEZOELECTRIC MEMS DEVICE

BACKGROUND

1. Field

This disclosure relates generally to micro electromechanical system (MEMS) devices, and more specifically, to self-poling piezoelectric MEMs devices.

2. Related Art

MEMS devices using piezoelectric thin films are attracting more and more attention, partly due to the fact that such devices enable low voltage operation and can easily convert electrical energy to mechanical energy or vice versa. One family of materials, namely perovskite type ceramics such as PZT, is particularly notable for its high piezoelectric constants. However, these piezoelectric materials have some critical draw backs: 1) the film of piezoelectric material needs to be electrically poled in order to have a usable piezoelectric property; and 2) the Currie Temperature of these piezoelectric materials is low. For example, PZT has a Currie Temperature (Tc) of around 360° C. At temperatures above one half of the PZT film's Currie Temperature (Tc/2), which corresponds to a approximate temperature of greater than 180° C. (>180° C.), the film starts to loose its piezoelectric property.

In most applications, finished MEMS based electronic devices need to go through a solder reflow process to be assembled onto a printed circuit board (PCB) to form a system. A most commonly used solder reflow temperature is around 260° C. Experiments have demonstrated that at a temperature of around 260° C., the piezoelectric coefficient of a PZT film decreases to less than ten percent (<10%) of its original post-poling value. Such a loss in piezoelectric coefficient disadvantageously degrades device performance and highly undesirable.

Accordingly, there is a need for an improved method and apparatus for overcoming the problems in the art as discussed above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
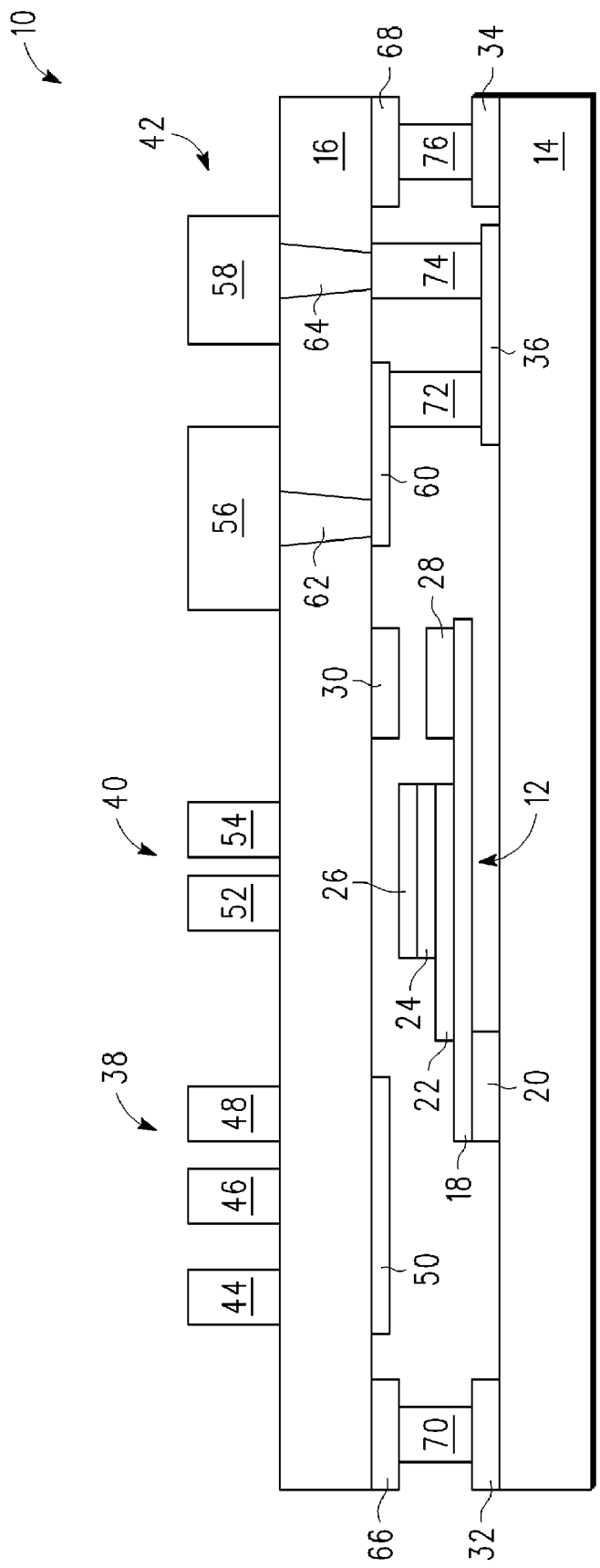
FIG. 1 is a cross-sectional view of one example of a self-poling piezoelectric based MEMS device configured for piezoelectric actuation in response to application of a device operating voltage according to one embodiment of the present disclosure.

The embodiments of the present disclosure are directed to MEMS devices which use piezoelectric material and its property, wherein the piezoelectric layer thickness is selected to be in a self-poling thickness range so that the poling field strength at the resultant device operating voltage exceeds a required poling field (for example, on the order of more than 100 to 150 KV/cm for PZT at room temperature) when the device operation voltage is applied to the device.

In addition, the embodiments of the present disclosure provide a self-poling piezoelectric film actuating MEMS device. That is, instead of poling a piezoelectric film before the MEMS device is assembled into a PCB board or other electronic system, the MEMS device is self-poled during one or more of the following: 1) a power-on stage of the electronic system in which the piezoelectric MEMS device is incorporated, and/or 2) a normal operation of the same system, by i) the device operating voltage and/or ii) another voltage supply that is made available to the MEMS device in the same system. The polarization orientation is maintained the same as the applied field direction when the MEMS device is operated. As a result, the piezoelectric film of the MEMS device is re-poled periodically, every time the electronic system is powered on or when the MEMS device is operated.

If high piezoelectric force or charge is required in which thicker film becomes necessary, the self-poling piezoelectric actuated MEMS device can be designed to use multiple piezoelectric capacitor cells (e.g., electrode/piezo/electrode) stacked in series mechanically instead of using one capacitor cell with a thick piezoelectric film. The piezoelectric film in each of the cells is made to have a thickness that corresponds to the self-poling thickness, as discussed herein, to enable the above-mentioned self-poling to be realized.

Accordingly, the embodiments of the present disclosure overcome problems in the art in a new manner by the use of piezoelectric film having a self-poling thickness that allows the device operation voltage to function as a poling electric field that exceeds the required poling field (for example, on the order of more than 100-150 KV/cm for PZT). The embodiments of the present disclosure advantageously enable greatly improved long term reliability of the piezo film and thus the long term reliability of the piezoelectric actuated MEMS device. Furthermore, the embodiments of the present disclosure can be advantageously used in the context of piezoelectric MEMS and sensor device implementations. According to another embodiment of the present disclosure, a method for piezoelectric MEMS device formation advantageously overcomes the previously discussed adverse re-flow temperature effect. The method also enables improved device reliability to be attained.

The semiconductor substrate or wafer described herein can be any semiconductor material or combinations of materials, such as gallium arsenide, silicon germanium, silicon-on-insulator (SOI), silicon, monocrystalline silicon, the like, and combinations of the above.

FIG. 1 is a cross-sectional view of one example of a self-poling piezoelectric based MEMS device 10 configured for piezoelectric actuation in response to application of a device operating voltage according to one embodiment of the present disclosure. In particular, MEMS device 10 includes a self-poling piezoelectric actuator 12 formed overlying a first substrate or wafer 14. MEMS device 10 further includes a second substrate or wafer 16 bonded to the first substrate or wafer. Briefly, self-poling piezoelectric actuator 12 includes a beam 18 anchored to the first substrate 14 via an anchor feature 20. Beam 18 and anchor feature 20 can comprise a dielectric or a conductor, selected according to the requirements of the particular MEMS application. Self-poling piezoelectric actuator 12 further includes at least a first electrode 22, a layer of piezoelectric material 24, and a second electrode 26.

With respect to various elements of the self-poling piezoelectric actuator 12, the first electrode 22 is disposed on the beam 18. The layer of piezoelectric material 24 comprises a piezoelectric material layer having a self-poling thickness and that overlies a portion of the first electrode 22. The second electrode 26 overlies the layer of piezoelectric material 24. According to the embodiments of the present disclosure, the layer of piezoelectric material 24 is self-poled in response to application of the device operating voltage across the first and second electrodes, the self-poled piezoelectric material 24 further having a poling direction established according to a polarity orientation of the device operating voltage as applied across the first and second electrodes, as will be discussed further herein below.

In addition, as illustrated in FIG. 1, a first switch contact 28 is disposed on the beam 18. A second switch contact 30 is disposed proximate the first switch contact 28, the second switch contact 30 being formed as a feature of the second substrate or wafer 16. Responsive to application of the device operating voltage across the first and second electrodes, the piezoelectric material layer 24 actuates and the first switch contact 28 is moved from a position of non-physical contact into physical contact with the second switch contact 30 in response to the actuation of the piezoelectric material 24.

Various additional features of wafers 14 and 16 are formed on the respective wafers according to the particular requirements of a given integrated MEMS device application. For example, features of wafer 14 may include bond pads 32 and 34, in addition to routing metal or conductor 36. Features of wafer 16 can include, for example, integrated passive devices generally indicated by reference numerals 38, 40 and 42. Integrated passive device 38 may include features 44, 46 and 48, as well as routing metal or conductor 50. Integrated passive device 40 may include features 52 and 54. Integrated passive device 42 may include features 56 and 58, as well as routing metal or conductor 60. In addition, wafer 16 may further include one or more thru-vias, for example, as indicated by reference numerals 62 and 64, in addition to one or more bond pads, for example, as indicated by reference numerals 66 and 68. Wafers 14 and 16 are bonded together via suitable conductive bumps or metal, for example, as indicated by reference numerals 72, 74, 76, and 78. In general, wafer bonding requires a process temperature of greater that 250° C. As a result, the process temperature of the wafer bonding process significantly degrades the PZT piezoelectric property of the PZT film if the film poling is performed prior to the bonding process. Wafer bonding is well known in the art and thus is not described further herein.

Figure 2:
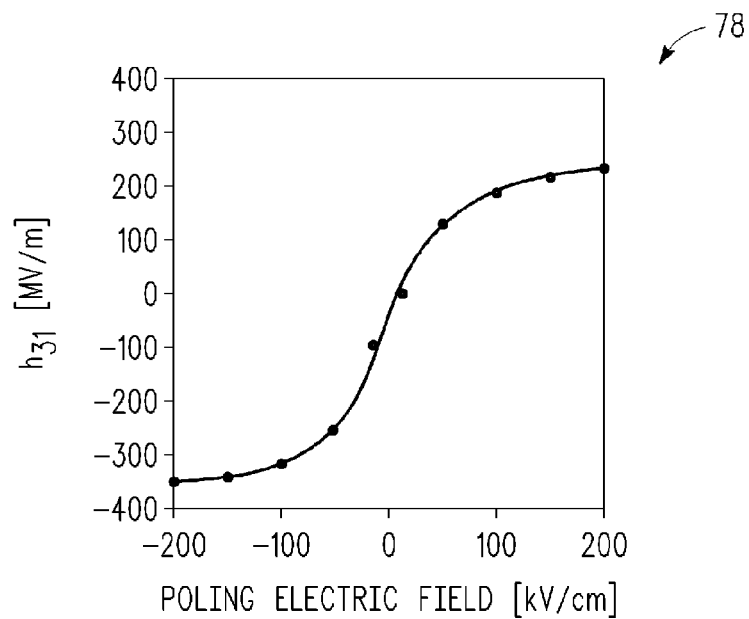
FIG. 2 is a graphical representation view of piezoelectric coefficient ($h_{31}$ [MV/m]) versus poling electric field (kV/cm) for one example of piezoelectric material at room temperature.

FIG. 2 is a graphical representation view 78 of piezoelectric coefficient ($h_{31}$ [MV/m]) versus poling electric field (kV/cm) for one example of piezoelectric material at room temperature as disclosed by Kaoru Yamashita, "Characterization of Piezoelectric Property of Sol-Gel PZT Thin Films and Its Improvement by Poling". In particular, the curve represents the piezoelectric coefficient versus poling electric field for PZT piezoelectric material at room temperature. As can be observed from the graph, a poling electric field of approximately 100 kV/cm or greater, up to a maximum positive poling electric field value at which saturation or breakdown occurs, is required to obtain a piezoelectric coefficient $h_{31}$ of approximately 200 MV/m. In addition, for a poling electric field of approximately −100 kV/cm or less, down to a maximum negative poling electric field value at which saturation or breakdown occurs, is required to obtain a piezoelectric coefficient $h_{31}$ of approximately −350 MV/m. Although the realized coefficient h31 (or e31 or d31, as the case may be for the particular coefficient) can be different for different PZT films, the required poling field strength is in general greater than 100 KV/cm-150 KV/cm.

In some cases, the PZT film may show relatively high piezoelectric coefficient after deposition without poling, in which case, the film is poled in-situ. This in-situ poled film, however, will still loose (or significantly degrade) its piezoelectric property after encountering a processing temperature of greater than 250° C. during wafer bonding or a subsequent reflow process. In such an instance, re-poling afterwards with a poling field of greater than 100 KV/cm-150 KV/cm is still required.

Figure 3:
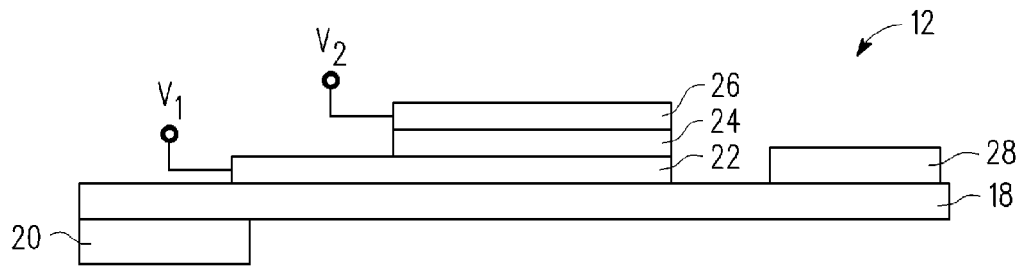
FIG. 3 is a cross-sectional view of a portion of a self-poling piezoelectric based MEMS device configured for piezoelectric actuation in response to application of a device operating voltage according to one embodiment of the present disclosure.

FIG. 3 is a cross-sectional view of a portion of a self-poling piezoelectric based MEMS device configured for piezoelectric actuation in response to application of a device operating voltage according to one embodiment of the present disclosure. As discussed with reference to FIG. 1, self-poling piezoelectric actuator 12 includes at least a first electrode 22, a layer of piezoelectric material 24, and a second electrode 26. The first electrode 22 is disposed on the beam 18. The layer of piezoelectric material 24 comprises a piezoelectric material layer having a self-poling thickness. The layer of piezoelectric material 24 overlies a portion of the first electrode 22. The second electrode 26 overlies the layer of piezoelectric material 24.

According to the embodiments of the present disclosure, the layer of piezoelectric material 24 is self-poled in response to application of the device operating voltage across the first and second electrodes. The device operating voltage is represented by the designations $V_1$ and $V_2$. In one embodiment, the designation $V_1$ represents ground potential, while the designation $V_2$ represents the maximum level of device operating voltage for a given MEMS device implementation. In another embodiment, the designation $V_2$ represents ground potential, while the designation $V_1$ represents the maximum level of device operating voltage for a given MEMS device implementation. Furthermore, in one embodiment, the device operating voltage comprises a voltage less than five volts. In another embodiment, the device operating voltage comprises a voltage in the range of 3 to 5 volts. In addition, the self-poled piezoelectric material 24 has a poling direction established according to a polarity orientation of the device operating voltage (i.e., of $V_1$ and $V_2$) as applied across the first and second electrodes, 22 and 26, respectively.

Furthermore, in one embodiment, the first switch contact 28 is disposed on the beam 18. In another embodiment, the first switch contact 28 is coupled to the beam 18. Still further, in another embodiment, reference numeral 28 designates a first conductor coupled to beam 18. In the later instance, the first conductor could comprise a plate of a capacitor, wherein reference numeral 30 of FIG. 1 designates a second conductor or conductive plate of a capacitor, the second conductive plate further having a dielectric (not shown) disposed between the first and second conductors or capacitor plates.

Figure 4:
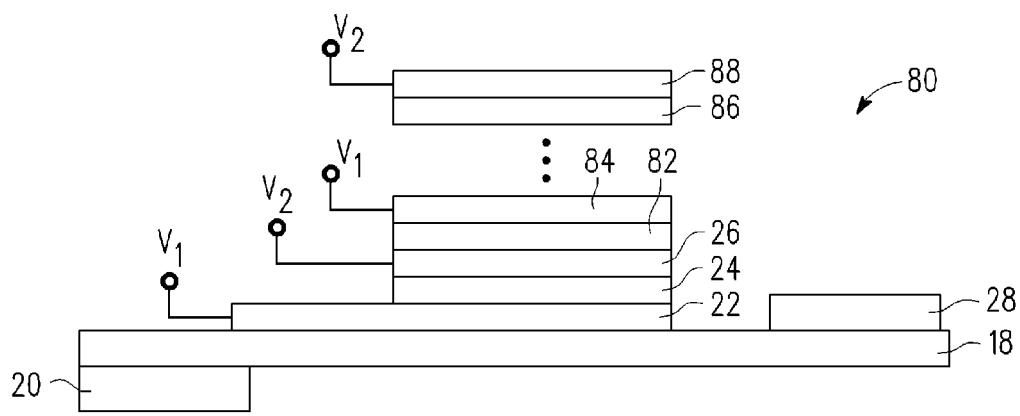
FIG. 4 is a cross-sectional view of a portion of a self-poling piezoelectric based MEMS device configured for piezoelectric actuation in response to application of a device operating voltage according to another embodiment of the present disclosure.

FIG. 4 is a cross-sectional view of a portion of a self-poling piezoelectric based MEMS device configured for piezoelectric actuation in response to application of a device operating voltage according to another embodiment of the present disclosure. The self-poling piezoelectric actuator 80 of FIG. 4 is similar to the self-poling piezoelectric actuator 12 of FIGS. 1 and 3 with differences as indicated in the following discussion. The self-poling piezoelectric actuator 80 further includes at least one additional pair of layers, for example, additional pair of layers indicated by reference numerals 82 and 84. The additional pair of layers may further include subsequent additional pairs of layers indicated by reference numerals 86 and 88, as well as the series of dots " . . . " illustrated there between. Each additional pair of layers comprises (i) a second layer of piezoelectric material (e.g., 82, 86) and (ii) a third electrode (e.g., 84, 88) overlying the second layer of piezoelectric material. The second layer of piezoelectric material also has a self-poling thickness and is disposed overlying one of (a) the second electrode 26 or (b) the third electrode (e.g., 84) of an immediately preceding additional pair of layers.

For a first additional pair of layers (82, 84) and every odd numbered additional pair of layers, the second layer (82) of piezoelectric material is self-poled in response to application of the device operating voltage ($V_2$ and $V_1$) across the second (26) and third electrodes (84), the self-poled second layer of piezoelectric material further having a poling direction established according to a polarity orientation of the device operating voltage ($V_2$ and $V_1$) as applied across the second and third electrodes, 26 and 84, respectively. In addition, the polarity orientation of the device operating voltage ($V_2$ and $V_1$) as applied across the second and third electrodes (26 and 84, respectively) of the first pair of additional layers and every odd numbered additional pair of layers is opposite to the polarity orientation of the device operating voltage ($V_1$ and $V_2$) as applied across the first and second electrodes (22 and 26, respectively).

Still further, for a second additional pair of layers and every even numbered additional pair of layers, the second layer of piezoelectric material is self-poled in response to application of the device operating voltage across the second and third electrodes. The self-poled second layer of piezoelectric material further has a poling direction established according to a polarity orientation of the device operating voltage as applied across the second and third electrodes. In addition, the polarity orientation of the device operating voltage ($V_1$ and $V_2$) as applied across the second and third electrodes (e.g., 84 and 88, respectively) of the second pair of layers and every even numbered additional pair of layers is opposite to the polarity orientation of the device operating voltage ($V_2$ and $V_1$) as applied across the second and third electrodes (e.g., 26 and 84, respectively) of the first additional pair of layers and every odd numbered additional pair of layers.

During operation, when $V_1$ and $V_2$ are applied, all of the PZT layers will contract at the same time due to the fact that (i) the applied field and (ii) the PZT poling orientation is the same direction, resulting in an effect that is similar to a single "electrode/PZT/electrode" cell having a much thicker PZT layer and a corresponding higher operation voltage.

By now it should be appreciated that there has been provided a self-poling piezoelectric based MEMS device configured for piezoelectric actuation in response to application of a device operating voltage. The MEMS device comprises a beam, a first electrode disposed on the beam, a layer of piezoelectric material having a self-poling thickness disposed overlying a portion of the first electrode, and a second electrode overlying the layer of piezoelectric material. The layer of piezoelectric material is self-poled in response to application of the device operating voltage across the first and second electrodes. The self-poled piezoelectric material also has a poling direction established according to a polarity orientation of the device operating voltage as applied across the first and second electrodes.

In another embodiment, the device further includes a first switch contact disposed on the beam and a second switch contact disposed proximate the first switch contact. Further responsive to application of the device operating voltage across the first and second electrodes, the piezoelectric material layer actuates and the first switch contact is moved from a position of non-physical contact into physical contact with the second switch contact in response to the actuation of the piezoelectric material.

In another embodiment, a second layer of piezoelectric material having a self-poling thickness is disposed overlying the second electrode. In addition, a third electrode overlies the second layer of piezoelectric material. The second layer of piezoelectric material is self-poled in response to application of the device operating voltage across the second and third electrodes. In addition, the self-poled second layer of piezoelectric material further includes a poling direction established according to a polarity orientation of the device operating voltage as applied across the second and third electrodes. Furthermore, the polarity orientation of the device operating voltage as applied across the second and third electrodes is opposite to the polarity orientation of the device operating voltage as applied across the first and second electrodes.

In one embodiment, the device operating voltage comprises a voltage in the range of less than or equal to five volts. In another embodiment, the device operating voltage comprises a voltage in the range of three to five volts. In a further embodiment, the layer of piezoelectric material comprises a perovskite type ceramic. For example, the perovskite type ceramic can comprise PZT.

In one embodiment, the self-poling thickness of the layer of piezoelectric material is in the range of 1000 angstroms to 3000 angstroms. In another embodiment, the self-poling thickness equals a thickness determined as a function of the device operating voltage divided by a poling field strength of greater than or equal to 100 KV/cm. In another embodiment, the poling field strength is greater than or equal to 150 KV/cm.

In another embodiment, the device further comprises at least one additional pair of layers. Each additional pair of layers comprises (i) a second layer of piezoelectric material and (ii) a third electrode overlying the second layer of piezoelectric material. The second layer of piezoelectric material further includes a self-poling thickness and is disposed overlying one of (a) the second electrode or (b) the third electrode of an immediately preceding additional pair of layers. In addition, for a first additional pair of layers and every odd numbered additional pair of layers, the second layer of piezoelectric material is self-poled in response to application of the device operating voltage across the second and third electrodes, the self-poled second layer of piezoelectric material further having a poling direction established according to a polarity orientation of the device operating voltage as applied across the second and third electrodes, further wherein the polarity orientation of the device operating voltage as applied across the second and third electrodes of the first pair of additional layers and every odd numbered additional pair of layers is opposite to the polarity orientation of the device operating voltage as applied across the first and second electrodes. Still further, for a second additional pair of layers and every even numbered additional pair of layers, the second layer of piezoelectric material is self-poled in response to application of the device operating voltage across the second and third electrodes, the self-poled second layer of piezoelectric material further having a poling direction established according to a polarity orientation of the device operating voltage as applied across the second and third electrodes, further wherein the polarity orientation of the device operating voltage as applied across the second and third electrodes of the second pair of layers and every even numbered additional pair of layers is opposite to the polarity orientation of the device operating voltage as applied across the second and third electrodes of the first additional pair of layers and every odd numbered additional pair of layers.

In another embodiment, a first switch contact is coupled to the beam and a second switch contact is disposed proximate the first switch contact. Responsive to application of the device operating voltage across the first and second electrodes, the piezoelectric material layer actuates and the first switch contact is moved from a position of non-physical contact into physical contact with the second switch contact in response to the actuation of the piezoelectric material.

In another embodiment, a self-poling piezoelectric based MEMS device configured for piezoelectric actuation in response to application of a device operating voltage, the MEMS device comprises a beam, a first electrode disposed on the beam, a layer of piezoelectric material having a self-poling thickness disposed overlying a portion of the first electrode, wherein the self-poling thickness equals a thickness determined as a function of the device operating voltage divided by a poling field strength of greater than or equal to 100 KV/cm, a second electrode overlying the layer of piezoelectric material, wherein the layer of piezoelectric material is self-poled in response to application of the device operating voltage across the first and second electrodes, the self-poled piezoelectric material further having a poling direction established according to a polarity orientation of the device operating voltage as applied across the first and second electrodes, wherein the device operating voltage comprises a voltage in the range of less than or equal to five volts, a first conductor coupled to the beam, and a second conductor disposed proximate the first conductor, wherein further responsive to application of the device operating voltage across the first and second electrodes, the piezoelectric material layer actuates and the first conductor is moved from a position of non-physical contact into physical contact with the second conductor in response to the actuation of the piezoelectric material.

The device can further comprise at least one additional pair of layers, wherein each additional pair of layers comprises (i) a second layer of piezoelectric material and (ii) a third electrode overlying the second layer of piezoelectric material, the second layer of piezoelectric material further having a self-poling thickness and disposed overlying one of (a) the second electrode or (b) the third electrode of an immediately preceding additional pair of layers, wherein for a first additional pair of layers and every odd numbered additional pair of layers, the second layer of piezoelectric material is self-poled in response to application of the device operating voltage across the second and third electrodes, the self-poled second layer of piezoelectric material further having a poling direction established according to a polarity orientation of the device operating voltage as applied across the second and third electrodes, further wherein the polarity orientation of the device operating voltage as applied across the second and third electrodes of the first pair of additional layers and every odd numbered additional pair of layers is opposite to the polarity orientation of the device operating voltage as applied across the first and second electrodes, further wherein for a second additional pair of layers and every even numbered additional pair of layers, the second layer of piezoelectric material is self-poled in response to application of the device operating voltage across the second and third electrodes, the self-poled second layer of piezoelectric material further having a poling direction established according to a polarity orientation of the device operating voltage as applied across the second and third electrodes, further wherein the polarity orientation of the device operating voltage as applied across the second and third electrodes of the second pair of layers and every even numbered additional pair of layers is opposite to the polarity orientation of the device operating voltage as applied across the second and third electrodes of the first additional pair of layers and every odd numbered additional pair of layers.

In yet another embodiment, a method of implementing a self-poling in a piezoelectric based MEMS device that is configured for piezoelectric actuation in response to application of a device operating voltage comprises: disposing a first electrode on a beam; disposing a layer of piezoelectric material overlying a portion of the first electrode, the layer of piezoelectric material having a self-poling thickness; and disposing a second electrode overlying the layer of piezoelectric material, wherein self-poling of the layer of piezoelectric material occurs in response to application of the device operating voltage across the first and second electrodes, the self-poled piezoelectric material further having a poling direction established according to a polarity orientation of the device operating voltage as applied across the first and second electrodes. The method can further comprise disposing at least one additional pair of layers overlying the second electrode, wherein each additional pair of layers comprises (i) a second layer of piezoelectric material and (ii) a third electrode overlying the second layer of piezoelectric material, the second layer of piezoelectric material further having a self-poling thickness and disposed overlying one of (a) the second electrode or (b) the third electrode of an immediately preceding additional pair of layers, wherein for a first additional pair of layers and every odd numbered additional pair of layers, the second layer of piezoelectric material is self-poled in response to application of the device operating voltage across the second and third electrodes, the self-poled second layer of piezoelectric material further having a poling direction established according to a polarity orientation of the device operating voltage as applied across the second and third electrodes, further wherein the polarity orientation of the device operating voltage as applied across the second and third electrodes of the first pair of additional layers and every odd numbered additional pair of layers is opposite to the polarity orientation of the device operating voltage as applied across the first and second electrodes, further wherein for a second additional pair of layers and every even numbered additional pair of layers, the second layer of piezoelectric material is self-poled in response to application of the device operating voltage across the second and third electrodes, the self-poled second layer of piezoelectric material further having a poling direction established according to a polarity orientation of the device operating voltage as applied across the second and third electrodes, further wherein the polarity orientation of the device operating voltage as applied across the second and third electrodes of the second pair of layers and every even numbered additional pair of layers is opposite to the polarity orientation of the device operating voltage as applied across the second and third electrodes of the first additional pair of layers and every odd numbered additional pair of layers.

The terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A self-poling piezoelectric based MEMS device configured for piezoelectric actuation in response to application of a device operating voltage, the MEMS device comprising:
   a beam;
   a first electrode disposed on the beam;
   a layer of piezoelectric material having a self-poling thickness disposed overlying a portion of the first electrode; and
   a second electrode overlying the layer of piezoelectric material, wherein the layer of piezoelectric material is self-poled in response to application of the device operating voltage across the first and second electrodes, the self-poled piezoelectric material further having a poling direction established according to a polarity orientation of the device operating voltage as applied across the first and second electrodes.

2. The device of claim 1, further comprising:
   a first switch contact disposed on the beam; and
   a second switch contact disposed proximate the first switch contact, wherein further responsive to application of the device operating voltage across the first and second electrodes, the piezoelectric material layer actuates and the first switch contact is moved from a position of non-physical contact into physical contact with the second switch contact in response to the actuation of the piezoelectric material.

3. The device of claim 1, further comprising:
   a second layer of piezoelectric material having a self-poling thickness disposed overlying the second electrode; and
   a third electrode overlying the second layer of piezoelectric material, wherein the second layer of piezoelectric material is self-poled in response to application of the device operating voltage across the second and third electrodes, the self-poled second layer of piezoelectric material further having a poling direction established according to a polarity orientation of the device operating voltage as applied across the second and third electrodes, wherein the polarity orientation of the device operating voltage as applied across the second and third electrodes is opposite to the polarity orientation of the device operating voltage as applied across the first and second electrodes.

4. The device of claim 1, wherein the device operating voltage comprises a voltage in the range of less than or equal to five volts.

5. The device of claim 1, wherein the device operating voltage comprises a voltage in the range of three to five volts.

6. The device of claim 1, wherein the layer of piezoelectric material comprises a perovskite type ceramic.

7. The device of claim 6, further wherein the perovskite type ceramic comprises PZT.

8. The device of claim 1, wherein the self-poling thickness of the layer of piezoelectric material is in the range of 1000 angstroms to 3000 angstroms.

9. The device of claim 1, wherein the self-poling thickness equals a thickness determined as a function of the device operating voltage divided by a poling field strength of greater than or equal to 100 KV/cm.

10. The device of claim 9, further wherein the poling field strength is greater than or equal to 150 KV/cm.

11. The device of claim 1, further comprising:
    at least one additional pair of layers, wherein each additional pair of layers comprises (i) a second layer of piezoelectric material and (ii) a third electrode overlying the second layer of piezoelectric material, the second layer of piezoelectric material further having a self-poling thickness and disposed overlying one of (a) the second electrode or (b) the third electrode of an immediately preceding additional pair of layers,
    wherein for a first additional pair of layers and every odd numbered additional pair of layers, the second layer of piezoelectric material is self-poled in response to application of the device operating voltage across the second and third electrodes, the self-poled second layer of piezoelectric material further having a poling direction established according to a polarity orientation of the device operating voltage as applied across the second and third electrodes, further wherein the polarity orientation of the device operating voltage as applied across the second and third electrodes of the first pair of additional layers and every odd numbered additional pair of layers is opposite to the polarity orientation of the device operating voltage as applied across the first and second electrodes,
    further wherein for a second additional pair of layers and every even numbered additional pair of layers, the second layer of piezoelectric material is self-poled in response to application of the device operating voltage across the second and third electrodes, the self-poled second layer of piezoelectric material further having a poling direction established according to a polarity orientation of the device operating voltage as applied across the second and third electrodes, further wherein the polarity orientation of the device operating voltage as applied across the second and third electrodes of the second pair of layers and every even numbered additional pair of layers is opposite to the polarity orientation of the device operating voltage as applied across the second and third electrodes of the first additional pair of layers and every odd numbered additional pair of layers.

12. The device of claim 1, further comprising:
    a first switch contact coupled to the beam; and
    a second switch contact disposed proximate the first switch contact, wherein further responsive to application of the device operating voltage across the first and second electrodes, the piezoelectric material layer actuates and the first switch contact is moved from a position of non-physical contact into physical contact with the second switch contact in response to the actuation of the piezo-electric material.

13. A self-poling piezoelectric based MEMS device configured for piezoelectric actuation in response to application of a device operating voltage, the MEMS device comprising:
a beam;
a first electrode disposed on the beam;
a layer of piezoelectric material having a self-poling thickness disposed overlying a portion of the first electrode, wherein the self-poling thickness equals a thickness determined as a function of the device operating voltage divided by a poling field strength of greater than or equal to 100 KV/cm;
a second electrode overlying the layer of piezoelectric material, wherein the layer of piezoelectric material is self-poled in response to application of the device operating voltage across the first and second electrodes, the self-poled piezoelectric material further having a poling direction established according to a polarity orientation of the device operating voltage as applied across the first and second electrodes, wherein the device operating voltage comprises a voltage in the range of less than or equal to five volts;
a first conductor coupled to the beam; and
a second conductor disposed proximate the first conductor, wherein further responsive to application of the device operating voltage across the first and second electrodes, the piezoelectric material layer actuates and the first conductor is moved from a position of non-physical contact into physical contact with the second conductor in response to the actuation of the piezoelectric material.

14. The device of claim 13, wherein the device operating voltage further comprises a voltage in the range of three to five volts.

15. The device of claim 14, wherein the layer of piezoelectric material comprises a perovskite type ceramic, further wherein the perovskite type ceramic comprises PZT.

16. The device of claim 15, wherein the self-poling thickness of the layer of piezoelectric material is in the range of 1000 angstroms to 3000 angstroms.

17. The device of claim 16, further wherein the poling field strength is greater than or equal to 150 KV/cm.

18. The device of claim 13, further comprising:
at least one additional pair of layers, wherein each additional pair of layers comprises (i) a second layer of piezoelectric material and (ii) a third electrode overlying the second layer of piezoelectric material, the second layer of piezoelectric material further having a self-poling thickness and disposed overlying one of (a) the second electrode or (b) the third electrode of an immediately preceding additional pair of layers,
wherein for a first additional pair of layers and every odd numbered additional pair of layers, the second layer of piezoelectric material is self-poled in response to application of the device operating voltage across the second and third electrodes, the self-poled second layer of piezoelectric material further having a poling direction established according to a polarity orientation of the device operating voltage as applied across the second and third electrodes, further wherein the polarity orientation of the device operating voltage as applied across the second and third electrodes of the first pair of additional layers and every odd numbered additional pair of layers is opposite to the polarity orientation of the device operating voltage as applied across the first and second electrodes,
further wherein for a second additional pair of layers and every even numbered additional pair of layers, the second layer of piezoelectric material is self-poled in response to application of the device operating voltage across the second and third electrodes, the self-poled second layer of piezoelectric material further having a poling direction established according to a polarity orientation of the device operating voltage as applied across the second and third electrodes, further wherein the polarity orientation of the device operating voltage as applied across the second and third electrodes of the second pair of layers and every even numbered additional pair of layers is opposite to the polarity orientation of the device operating voltage as applied across the second and third electrodes of the first additional pair of layers and every odd numbered additional pair of layers.

19. A method of implementing a self-poling in a piezoelectric based MEMS device that is configured for piezoelectric actuation in response to application of a device operating voltage, the method comprising:
disposing a first electrode on a beam;
disposing a layer of piezoelectric material overlying a portion of the first electrode, the layer of piezoelectric material having a self-poling thickness; and
disposing a second electrode overlying the layer of piezoelectric material, wherein self-poling of the layer of piezoelectric material occurs in response to application of the device operating voltage across the first and second electrodes, the self-poled piezoelectric material further having a poling direction established according to a polarity orientation of the device operating voltage as applied across the first and second electrodes.

20. The method of claim 19, further comprising:
disposing at least one additional pair of layers overlying the second electrode, wherein each additional pair of layers comprises (i) a second layer of piezoelectric material and (ii) a third electrode overlying the second layer of piezoelectric material, the second layer of piezoelectric material further having a self-poling thickness and disposed overlying one of (a) the second electrode or (b) the third electrode of an immediately preceding additional pair of layers,
wherein for a first additional pair of layers and every odd numbered additional pair of layers, the second layer of piezoelectric material is self-poled in response to application of the device operating voltage across the second and third electrodes, the self-poled second layer of piezoelectric material further having a poling direction established according to a polarity orientation of the device operating voltage as applied across the second and third electrodes, further wherein the polarity orientation of the device operating voltage as applied across the second and third electrodes of the first pair of additional layers and every odd numbered additional pair of layers is opposite to the polarity orientation of the device operating voltage as applied across the first and second electrodes,
further wherein for a second additional pair of layers and every even numbered additional pair of layers, the second layer of piezoelectric material is self-poled in response to application of the device operating voltage across the second and third electrodes, the self-poled second layer of piezoelectric material further having a poling direction established according to a polarity orientation of the device operating voltage as applied across the second and third electrodes, further wherein the polarity orientation of the device operating voltage as applied across the second and third electrodes of the second pair of layers and every even numbered additional pair of layers is opposite to the polarity orientation of the device operating voltage as applied across the second and third electrodes of the first additional pair of layers and every odd numbered additional pair of layers.

* * * * *